United States Patent
Zhou et al.

(10) Patent No.: US 8,747,681 B2
(45) Date of Patent: Jun. 10, 2014

(54) PREPARATION METHOD OF FLUORESCENT POWDER LAYER

(75) Inventors: Mingjie Zhou, Shenzhen (CN); Wenbo Ma, Shenzhen (CN); Yugang Liu, Shenzhen (CN)

(73) Assignee: Ocean's King Lighting Science & Technology Co., Ltd., Shenzhen (CN)

( * ) Notice: Subject to any disclaimer, the term of this patent is extended or adjusted under 35 U.S.C. 154(b) by 0 days.

(21) Appl. No.: 13/810,058

(22) PCT Filed: Jul. 14, 2010

(86) PCT No.: PCT/CN2010/075139
§ 371 (c)(1),
(2), (4) Date: Jan. 14, 2013

(87) PCT Pub. No.: WO2012/006774
PCT Pub. Date: Jan. 19, 2012

(65) Prior Publication Data
US 2013/0112654 A1    May 9, 2013

(51) Int. Cl.
*B29D 11/00* (2006.01)
(52) U.S. Cl.
USPC .............................................. 216/24; 427/66
(58) Field of Classification Search
USPC .............................................. 216/24; 427/66
See application file for complete search history.

(56) References Cited

FOREIGN PATENT DOCUMENTS

| CN | 1624945 | 6/2005 |
|---|---|---|
| CN | 101582475 | 11/2009 |
| CN | 201439880 | 4/2010 |
| CN | 101728151 | 6/2010 |
| JP | 2008-078659 | 4/2008 |

*Primary Examiner* — Roberts Culbert
(74) *Attorney, Agent, or Firm* — Hamre, Schumann, Mueller & Larson, P.C.

(57) ABSTRACT

A preparation method of the fluorescent powder layer (108, 208) is provided. The said preparation method is carried out as following steps: step 1, a fluorescent powder layer (102, 202) is coated on one surface of a flat transparent substrate (101, 201); step 2, the surface of a board (103, 203) is shaped into a curved surface (104, 204); step 3, the board (103, 203) of step 2 is arranged on the substrate (101, 201) coated with the fluorescent powder layer (102, 202) of step 1; the curved surface (104, 204) of the board (103, 203) faces the substrate (101, 201), and the fluorescent powder layer (102, 202) is sandwiched between the substrate (101, 201) and the board (103, 203); step 4, the substrate (101, 201) is softened by heating, a pressure is then applied to the board (103, 203) so that the fluorescent powder layer (102, 202) sandwiched between the substrate (101, 201) and the board (103, 203) forms the fluorescent powder layer (108, 208) having the same curved shape as the curved surface (104, 204) of the board (103, 203) by the pressure, and the fluorescent powder layer (108, 208) on the substrate (101, 201) is completed after cooling.

11 Claims, 3 Drawing Sheets

PREPARATION METHOD OF FLUORESCENT POWDER LAYER

TECHNICAL FIELD

The present invention relates to a preparation method of a fluorescent powder layer, particularly, to a preparation method of a non-planar fluorescent powder layer for the packaging of FED device and LED device,

BACKGROUND

The structure of a phosphor powder is an important factor that affects the luminous efficiency of all kinds of electric light sources. The flat-plate shaped phosphor powder layer is a typical phosphor powder structure currently used in many electric light source devices, such as in an FED device, the phosphor powder is coated on the planar anode material to form a phosphor powder layer, and the phosphor powder layer emits light under the accelerated bombardment of the electron beam emitted from the cathode; another example is for the LED light source, packaging the LED light source with a flat-plate shaped phosphor powder layer is another important type. It has been reported that, compared to the flat-plate shaped phosphor powder layer, the non-planar phosphor powder layer with concavo-convex structure on the surface may improve the luminous efficiency of the FED device and LED device packaged thereby, because the area of the phosphor powder layer in unit area is increased.

Currently, however, the main preparation methods of phosphor powder layer are as follows: precipitation process, silk-screen printing process and spin coating method, and these processes can only be used to manufacture a flat-plate shaped phosphor powder layer on a flat surface, but it is difficult to obtain a non-planar phosphor powder layer with good consistency and uniformity by these processes. Accordingly, a preparation method of a non-planar phosphor powder layer is needed urgently.

SUMMARY

A technical problem solved by the present invention is to provide a preparation method of a fluorescent powder layer with good consistency and uniformity and may improve the luminous efficiency of a luminescent device.

The technical solution to solve the technical problem of the present invention is: provide a preparation method of a phosphor powder layer, which comprises following steps:

step one, coating a fluorescent powder layer on one surface of a flat-plate shaped transparent substrate;

step two, forming a space curved surface shape on a sheet by surface processing;

step three, disposing the sheet obtained in step two on the fluorescent powder layer coated substrate of step one, wherein the side with a space curved surface shape of the sheet faces to the substrate, and the fluorescent powder layer is sandwiched between the substrate and the sheet;

step four, softening the substrate by heating, then applying a pressure to the sheet thus the fluorescent powder layer sandwiched between the substrate and the sheet forms a fluorescent powder layer having the same curved surface shape as that of the sheet under the pressure, and a fluorescent powder layer arranged on the substrate is obtained after cooling.

In step one of the preparation method according to the present invention, the transparent substrate is a glass or a transparent resin or an organic glass.

In step one, the said glass has a high transparency in the visible light band, and the softening temperature thereof is less than 1000° C. Preferably, the softening temperature of the glass is less than 600° C.

In step one, the thickness of the phosphor powder layer is controlled to be in the range of 10 μm to 80 μm, the phosphor powder is coated by silk-screen printing or sedimentation or spraying.

In step two, the material of the sheet is a ceramic or a quartz glass or a metal, the processing is machining or etching.

In step two, the material of the sheet is a glass or a transparent resin or an organic glass, the treating process is machining or etching.

Compared to the existing technology, according to the preparation method of a fluorescent powder layer of the present invention, the surface shape of the fluorescent powder layer can be designed, and a phosphor powder layer having a determined curved shape and good consistency and good uniformity can be obtained. In the preparation method of a fluorescent powder layer according to the present invention, a non-planar phosphor powder layer structure disposed on the surface of the glass or inside the glass may be produced by designing the surface shape of the mold or the glass plate, and the non-planar phosphor powder layer may increase the coating area in unit area of the phosphor powder, thus increase the effective excited area in unit area thereof, and it can be employed in the packaging of LED, FED or other luminescent devices, and may improve the luminous efficiency of the luminescent devices.

BRIEF DESCRIPTION OF THE DRAWINGS

The present invention will be described in detail with reference to the Figures and the Examples, wherein.

DETAILED DESCRIPTION OF THE PREFERRED EMBODIMENTS

Objects, embodiments and advantages of the present invention will be explained below in detail with reference to the Figures and embodiments. However, it should be appreciated that the following description of the embodiments is merely exemplary in nature and is not intended to limit the invention.

Figure 1:
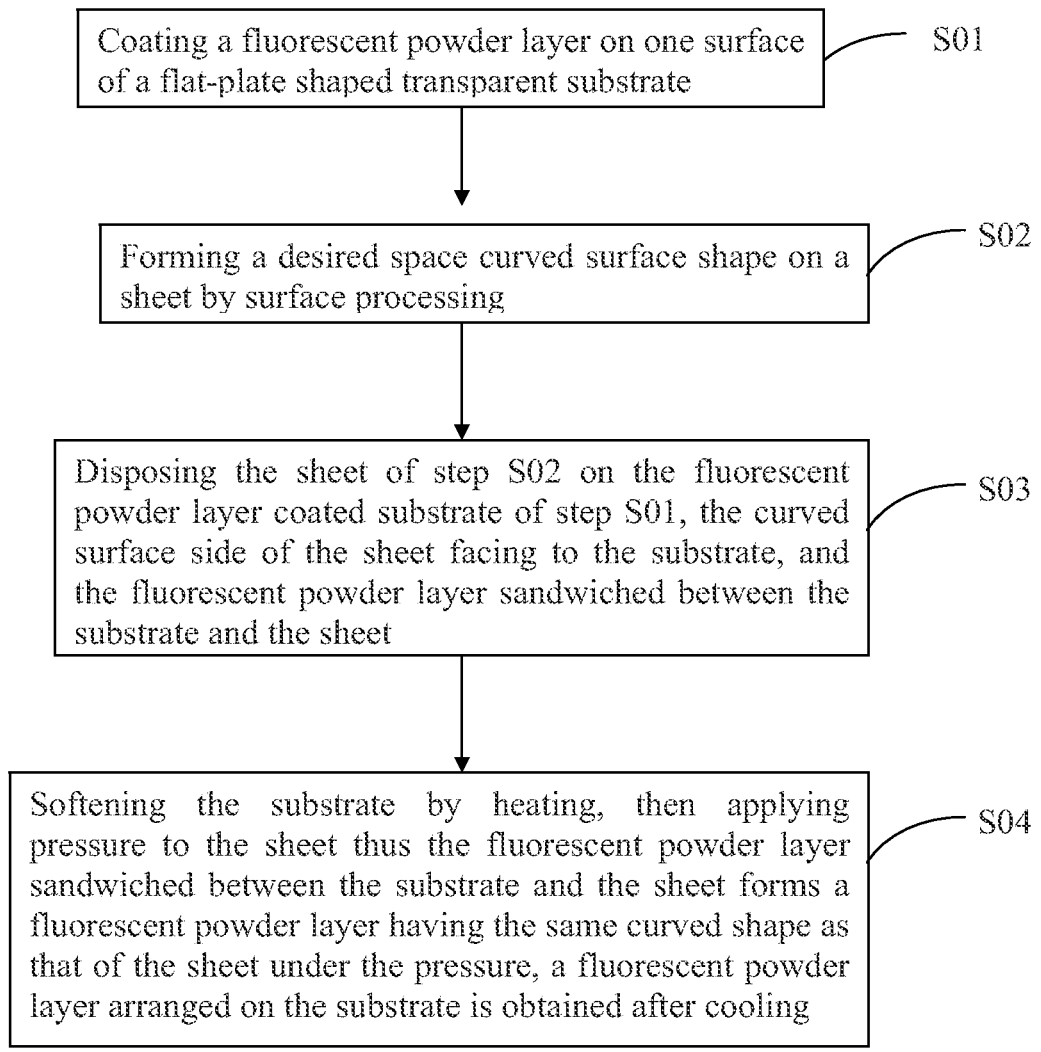
FIG. 1 is a flow chart of the preparation method of a phosphor powder layer of the present invention.

Referring to FIG. 1, a flow of the preparation method of the phosphor powder layer of the present invention is shown, the preparation method comprises the following steps:

step S01: coating a fluorescent powder layer on one surface of a flat-plate shaped transparent substrate;

step S02, forming a desired space curved surface shape on a sheet by surface processing;

step S03, disposing the sheet obtained in step S02 on the fluorescent powder layer coated substrate of step S01, wherein the side with a curved surface shape of the sheet faces to the substrate, and the fluorescent powder layer is sandwiched between the substrate and the sheet;

step S04, softening the substrate by heating, then applying a pressure to the sheet thus the fluorescent powder layer sandwiched between the substrate and the sheet forms a fluorescent powder layer having the same curved surface shape as that of the sheet under the pressure, and a fluorescent powder layer arranged on the substrate is obtained after cooling.

In step S01, the transparent substrate is a glass or a transparent resin or an organic glass. Preferably, the transparent substrate is a glass, the glass has a high transparency in the visible light band, and the softening temperature thereof is less than 1000° C. Preferably, the softening temperature of the glass plate is less than 600° C. Furthermore, the thickness of the phosphor powder layer is controlled to be in the range of 10 μm to 80 μm, the phosphor powder is coated by silk-screen printing or sedimentation or spraying.

In step S02, the material of the sheet is a ceramic or a quartz glass or a metal, the processing is machining or etching.

Alternatively, in step S02, the material of the sheet is a glass or a transparent resin or an organic glass, the material of the sheet is the same as that of the substrate, and the processing is machining or etching. Accordingly, in step S04, the substrate and the sheet are heated until they are softened, following the application of pressure, a fluorescent powder layer having the same shape as the curved surface shape of the sheet and sandwiched between the substrate and the sheet is obtained.

Specifically, according to the preparation method of a fluorescent powder layer of the present invention, the phosphor powder layer may be disposed on the surface of a glass plate, or inside a glass plate.

The phosphor powder material of the phosphor powder layer may be optionally any one that does not react with the glass at the softening temperature of the glass, which may be a phosphor powder suitable for an excitation by the cathode ray, such as $Y_2SiO_5$:Tb phosphor powder, $Y_2O_3$:Eu phosphor powder and the like, which also may be a phosphor powder suitable for an optical excitation, such as YAG:Ce phosphor powder, silicate phosphor powder and the like. The non-planar phosphor powder layer has a shape of space curved surface. The shape of the curved surface may be designed according to various demands, which may be formed by the periodical arrangement of a number of convex or concave structures, or may be a shape of any disordered space curved surface.

By means of the preparation method of a non-planar fluorescent powder layer of the present invention, the surface shape of the fluorescent powder layer may be designed, and a phosphor powder layer having a determined curved surface shape and good consistency and good uniformity can be obtained. Furthermore, by the preparation method of a fluorescent powder layer of the present invention, a non-planar phosphor powder layer structure disposed on the surface of the glass or inside the glass may be produced by designing the surface shape of the mold or the glass plate, and the non-planar phosphor powder layer may increase the coating area in unit area of the phosphor powder, thus increase the effective excited area in unit area thereof, and it can be used in the packaging of LED, FED and other luminescent devices, and the phosphor powder layer may improve the luminous efficiency of the luminescent devices.

Different preparation methods and other characteristics of the phosphor powder layer according to the present invention will be explained in detail referring to following Examples.

Example 1

Figure 2:
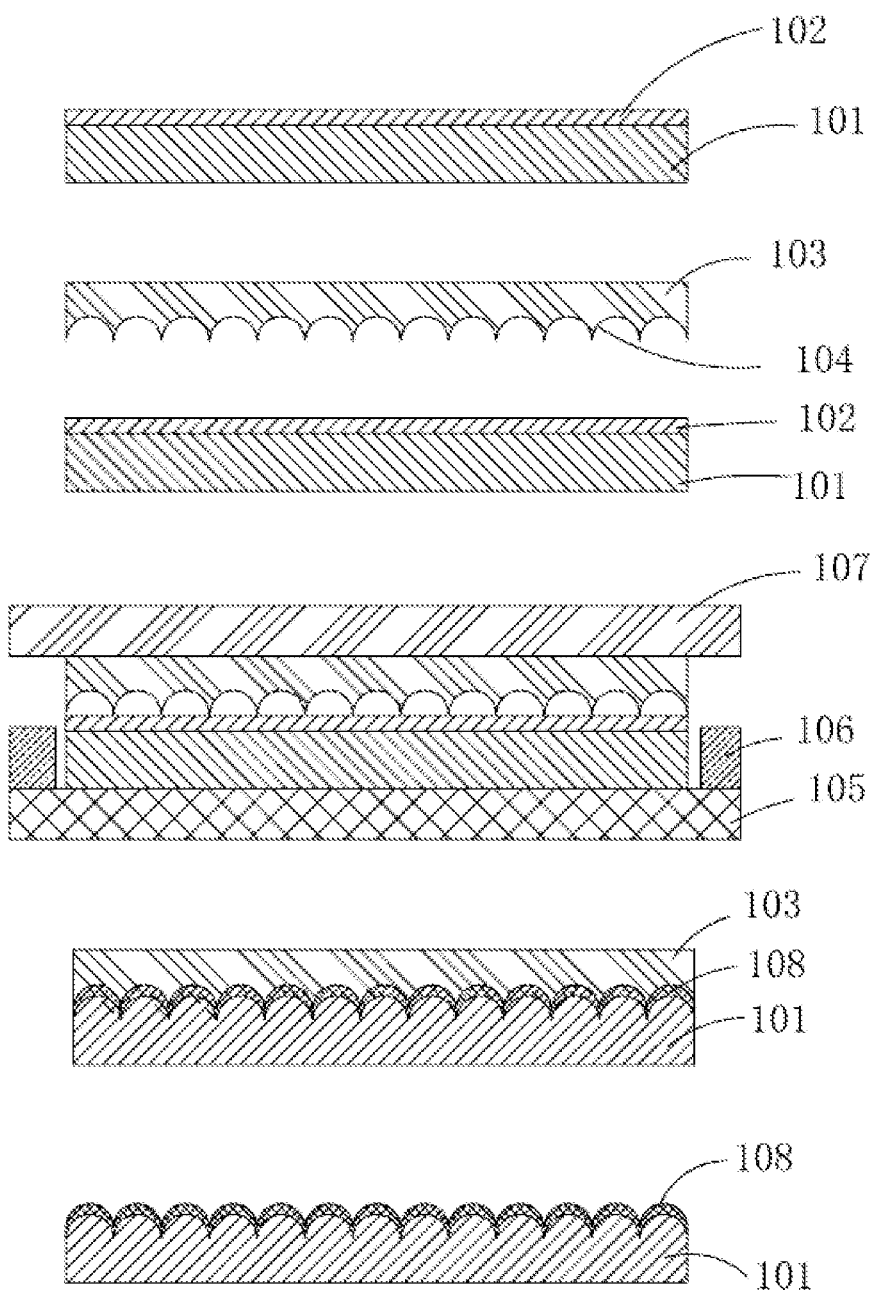
FIG. 2 is a schematic diagram of the phosphor powder layer on the surface of a glass prepared in Example 1 according to the present invention.

The glass employed in this Example was a sodium borosilicate system glass. The glass was ground, polished, and the thickness thereof was controlled to be 3 mm, and the phosphor powder employed was $Y_2SiO_5$:Tb. The process flow of manufacturing a non-planar $Y_2SiO_5$:Tb phosphor powder layer was shown in FIG. 2. Firstly, a layer of phosphor powder layer 102 with 50 μm thickness was coated on the prepared glass plate 101 by screen printing technique. Meanwhile a ceramic sheet 103 was prepared and the surface 104 having periodically recurring concave structure was formed on the ceramic sheet 103 by machining method, then the ceramic sheet 103 was placed on the upper side of the phosphor powder layer, and as a whole, they were disposed on another ceramic flat plate 105, and a number of barriers 106 with adjustable height were placed around the glass plate 101, then a heavy object 107 was placed on the ceramic sheet 103, wherein the function of the barrier 106 was to control the final thickness of the glass after softened by heating and under the gravity pressure of the heavy object 107. The glass plate 101 bearing the phosphor powder layer, the ceramic sheet 103, the ceramic flat plate 105, the barriers 106 and the heavy object 107 were carefully placed in a high-temperature furnace, and heated to 790° C. for 150 minutes, thereby the glass plate 101 was softened by the moulding pressure of the ceramic sheet 103, and the phosphor powder entered into the glass plate 101, and a non-planar phosphor powder layer 108 with the same curved surface shape as that of the ceramic sheet 103 was formed on the surface of the glass. The obtained non-planar phosphor powder layer may be used for the packaging of FED devices, it can enhance the luminous efficiency of the FED devices because of the increased coating area of the phosphor powder in unit area.

Example 2

Figure 3:
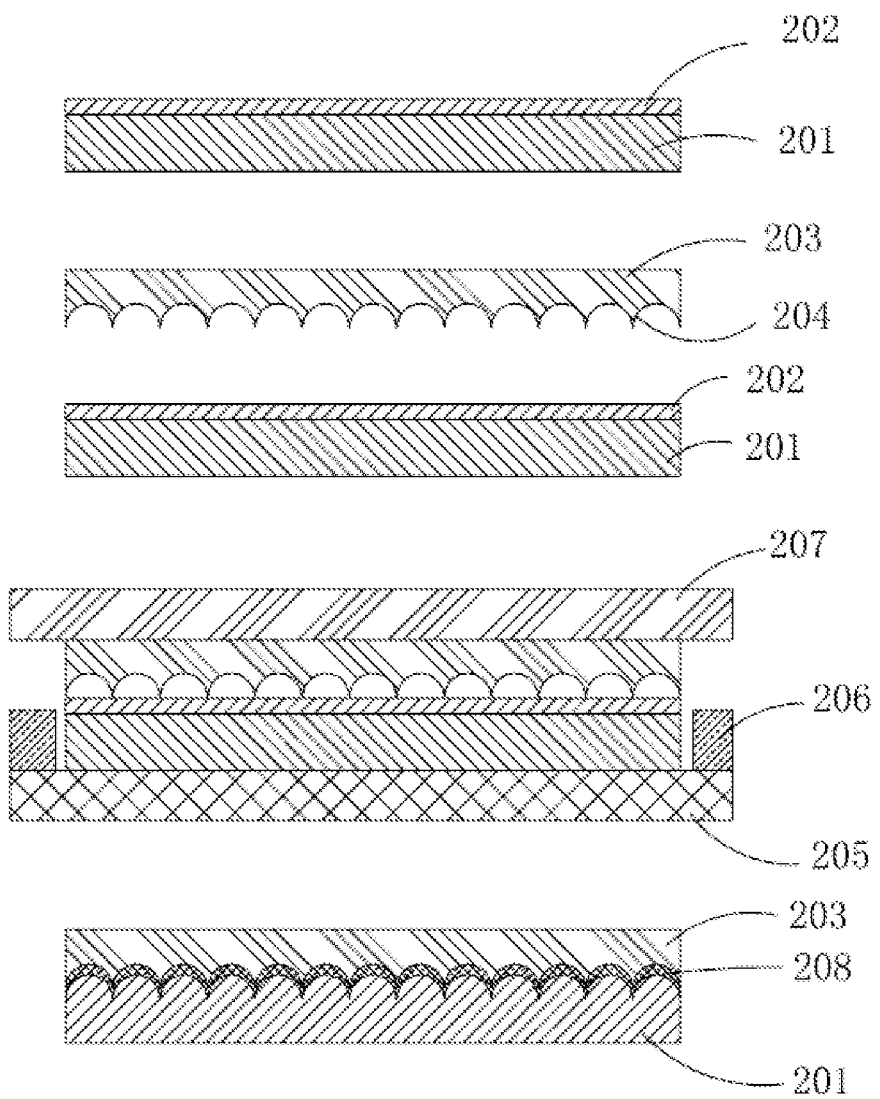
FIG. 3 is a schematic diagram of the phosphor powder layer inside a glass present invention prepared in Example 2 according to the present invention.

The glass employed in this Example was composed of a sodium-lithium-zinc-silicon system glass. The glass was ground, polished, and the thickness thereof was controlled to be 2 mm, and the phosphor powder employed was YAG:Ce system phosphor powder, which was commercially obtained. The process flow of manufacturing a non-planar YAG:Ce phosphor powder layer was shown in FIG. 3. Firstly, a layer of phosphor powder 202 with 20 μm thickness was coated on the prepared glass plate 201 by sedimentation technique. Meanwhile a flat glass sheet 203 with 3 mm thickness was prepared and the unordered roughened surface 204 was formed thereon by etching method, then the flat glass sheet 203 with roughened surface was placed on the upper side of the phosphor powder, and as a whole, they were disposed on another ceramic flat plate 205, and a number of barriers 206 with adjustable height were placed around the glass plate, then a heavy object 207 was placed on the flat glass sheet 203. The function of the harrier 206 was to control the final thickness of the glass after softened by heating and under the gravity pressure of the heavy object 207. The glass plate 201 bearing the phosphor powder layer, the flat glass sheet 203 with roughened surface, the ceramic flat plate 205, the barriers 206 and the heavy object 207 were carefully placed in a high-temperature furnace, and heated to 600° C. for 100 minutes, thereby the glass plate 201 was softened, and the upper glass and the lower glass were combined together under the pressure of gravity and the shape of the phosphor powder was formed to be the same as that of the upper flat glass sheet under the pressure thereof, thus to give a non-planar phosphor powder layer 208 located inside the glass. This non-planar phosphor powder layer may be used for the packaging of LED, in this case it can enhance the luminous efficiency of the LED devices because of the increased coating area of the phosphor powder in unit area.

The description above is merely the preferable embodiments of the present invention and not intended to limit the present invention. And all changes, equivalent substitution and improvements which come within the meaning and range of equivalency of the present invention are intended to be embraced therein.

What is claimed is:

1. A preparation method of a phosphor powder layer, comprising:
   step one, coating a fluorescent powder layer on a surface of a transparent substrate, the transparent substrate being a flat-plate shape;
   step two, forming a curved surface on a sheet by surface processing;
   step three, disposing the sheet obtained in step two on the fluorescent powder layer coated on the transparent substrate of step one, wherein the curved surface of the sheet faces to the substrate, and the fluorescent powder layer is sandwiched between the substrate and the sheet;
   step four, softening the substrate by heating, then applying a pressure to the sheet so that the fluorescent powder layer sandwiched between the substrate and the sheet forms the phosphor powder layer having the same curved surface shape as the curved surface of the sheet under the pressure, and the phosphor powder layer arranged on the substrate is obtained after cooling,
   wherein the phosphor powder layer includes a phosphor powder material selected from the group consisting of $Y_2SiO_5$:Tb phosphor powder, $Y_2O_3$:Eu phosphor powder, YAG:Ce phosphor powder, and silicate phosphor powder.

2. The preparation method of a phosphor powder layer of claim 1, wherein the transparent substrate in step one is a glass or a transparent resin or an organic glass.

3. The preparation method of a phosphor powder layer of claim 2, wherein the softening temperature of the glass in step one is less than 1000° C.

4. The preparation method of a phosphor powder layer of claim 3, wherein the softening temperature of the glass is less than 600° C.

5. The preparation method of a phosphor powder layer of claim 1, wherein the thickness of the phosphor powder layer in step one is controlled to be in the range of 10 μm to 80 μm, the phosphor powder is coated by silk-screen printing, or sedimentation or spraying.

6. The preparation method of a phosphor powder layer of claim 1, wherein the material of the sheet in step two is a ceramic or a quartz glass or a metal, the processing is machining or etching.

7. The preparation method of a phosphor powder layer of claim 1, wherein the material of the sheet in step two is a glass or a transparent resin or an organic glass, the treating process is machining or etching.

8. The preparation method of claim 1, wherein the curved surface of the sheet has a periodic concave structure.

9. The preparation method of claim 1, wherein step four further comprises indenting the surface of the substrate by applying the pressure to the sheet to form a curved surface on the substrate, the curved surface of the substrate is complementary to the curved surface of the sheet, and at least a portion of phosphor powder layer is located between the curved surface of the substrate and the curved surface of the sheet.

10. The preparation method of claim 1, wherein step four further comprises combining the sheet with the substrate by applying the pressure to the sheet.

11. The preparation method of claim 10, wherein the sheet and the substrate are made of a glass, and when the sheet and the substrate are combined, the phosphor power layer is located inside the glass.

* * * * *